United States Patent
Brown et al.

(10) Patent No.: US 11,195,779 B2
(45) Date of Patent: Dec. 7, 2021

(54) ELECTRONIC MODULE FOR MOTHERBOARD

(71) Applicant: RAYTHEON COMPANY, Waltham, MA (US)

(72) Inventors: Michael Benjamin Brown, Palos Verdes Peninsula, CA (US); Alberto F. Viscarra, Torrance, CA (US); Michael M. Fitzgibbon, Playa Del Rey, CA (US); John A. Crockett, Jr., Anaheim, CA (US); Chad E. Patterson, Los Angeles, CA (US); Kevin C. Rolston, Westchester, CA (US); Duke Quach, San Gabriel, CA (US); Kevin P. Agustin, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/828,933

(22) Filed: Mar. 24, 2020

(65) Prior Publication Data
US 2021/0043542 A1    Feb. 11, 2021

Related U.S. Application Data

(60) Provisional application No. 62/885,148, filed on Aug. 9, 2019.

(51) Int. Cl.
*H01L 23/40* (2006.01)
*H05K 7/20* (2006.01)
(Continued)

(52) U.S. Cl.
CPC ........ *H01L 23/4006* (2013.01); *H05K 3/325* (2013.01); *H05K 7/1061* (2013.01);
(Continued)

(58) Field of Classification Search
CPC .......................... H05K 7/1061–1069
See application file for complete search history.

(56) References Cited

U.S. PATENT DOCUMENTS

| | | | |
|---|---|---|---|
| 5,473,510 A | 12/1995 | Dozier, II | |
| 5,619,399 A | 4/1997 | Mok | |

(Continued)

FOREIGN PATENT DOCUMENTS

| | | | |
|---|---|---|---|
| EP | 1 699 079 A2 | 9/2006 | |
| EP | 2 770 530 A2 | 8/2014 | |
| WO | WO 2013/089780 A1 | 6/2013 | |

OTHER PUBLICATIONS

RSP Techniolgy, RS Alloys Overview, 1 page, downloaded from http://www.rsp-technology.com/site-media/user-uploads/rsp_alloys_overview_2018lr.pdf on Jan. 6, 2021, No date (Year: 0000).*

(Continued)

*Primary Examiner* — Robert J Hoffberg
(74) *Attorney, Agent, or Firm* — Lewis Roca Rothgerber Christie LLP

(57) ABSTRACT

A module. In some embodiments, the module includes a substrate; a plurality of electronic components, secured to an upper surface of the substrate; a thermally conductive heat spreader, on the electronic components and in thermal contact with an electronic component of the plurality of electronic components; a standoff, between the substrate and the heat spreader; an alignment element, extending into the substrate; a hard stop, under the substrate; and a plurality of compressible interconnects, under the substrate, and extending through the hard stop. The electronic components may be within a sight area of the substrate. The module may be configured to transmit a compressive load from an upper surface of the standoff to a lower surface of the substrate through a load path not including any of the electronic components.

18 Claims, 12 Drawing Sheets

(51) Int. Cl.
H05K 7/10 (2006.01)
H05K 3/32 (2006.01)

(52) U.S. Cl.
CPC ..... *H05K 7/20445* (2013.01); *H05K 7/20454* (2013.01); *H01L 2023/405* (2013.01); *H01L 2023/4068* (2013.01); *H01L 2023/4087* (2013.01)

(56) References Cited

U.S. PATENT DOCUMENTS

| | | | |
|---|---|---|---|
| 5,675,302 A | 10/1997 | Howard et al. | |
| 5,703,753 A | 12/1997 | Mok | |
| 5,802,707 A | 9/1998 | Brownell et al. | |
| 5,963,428 A | 10/1999 | Salmonson et al. | |
| 6,226,179 B1 | 5/2001 | Lee | |
| 6,349,465 B1 | 2/2002 | Brownell et al. | |
| 6,417,747 B1 | 7/2002 | Dearden et al. | |
| 6,452,113 B2* | 9/2002 | Dibene, II | G06F 1/18 174/260 |
| 6,459,582 B1* | 10/2002 | Ali | H01L 23/4006 257/715 |
| 6,483,708 B2* | 11/2002 | Ali | H01L 23/4006 257/719 |
| 6,542,366 B2 | 4/2003 | Davis et al. | |
| 6,549,410 B1 | 4/2003 | Cohen | |
| 6,756,669 B2 | 6/2004 | Houle et al. | |
| 6,947,293 B2* | 9/2005 | DiBene, II | G06F 1/18 257/E23.088 |
| 6,958,670 B2 | 10/2005 | Winslow et al. | |
| 7,245,507 B2* | 7/2007 | DiBene, II | G06F 1/18 257/691 |
| 7,352,586 B2 | 4/2008 | Kuang et al. | |
| 7,658,617 B1 | 2/2010 | Brodsky et al. | |
| 7,838,987 B2* | 11/2010 | So | H05K 3/303 257/718 |
| 9,013,869 B2* | 4/2015 | Degner | G06F 1/20 361/679.47 |
| 9,478,476 B2* | 10/2016 | Mallik | H01L 23/34 |
| 9,521,789 B2 | 12/2016 | Grossman et al. | |
| 9,818,669 B2 | 11/2017 | Jones et al. | |
| 10,327,356 B2 | 6/2019 | Wei et al. | |
| 10,638,629 B2* | 4/2020 | Thompson | H05K 7/12 |
| 2003/0156400 A1* | 8/2003 | Dibene, II | H05K 3/368 361/803 |
| 2009/0283902 A1 | 11/2009 | Bezama et al. | |
| 2010/0208422 A1 | 8/2010 | Tai et al. | |
| 2013/0259601 A1 | 10/2013 | Létourneau | |
| 2014/0239488 A1* | 8/2014 | Kobayashi | H01L 23/36 257/718 |

OTHER PUBLICATIONS

International Search Report for corresponding International Application No. PCT/US2020/044334, filed Jul. 30, 2020, International Search Report dated Nov. 3, 2020 and dated Nov. 18, 2020 (5 pgs.).
Written Opinion of the International Searching Authority for corresponding International Application No. PCT/US2020/044334, filed Jul. 30, 2020, Written Opinion of the International Searching Authority dated Nov. 18, 2020 (6 pgs.).

* cited by examiner

ELECTRONIC MODULE FOR MOTHERBOARD

CROSS-REFERENCE TO RELATED APPLICATION(S)

The present application claims priority to and the benefit of U.S. Provisional Application No. 62/885,148, filed Aug. 9, 2019, entitled "ELECTRONIC MODULE FOR MOTHERBOARD", the entire content of which is incorporated herein by reference.

FIELD

One or more aspects of embodiments according to the present invention relate to electronic modules, and more particularly to a module for use in a system in which multiple densely-spaced modules are secured to a motherboard.

BACKGROUND

In commercial and military applications (e.g., array antennas for wireless communications or for radar systems) a plurality of electronic modules (e.g., transmit-receive modules) may be secured to a motherboard in close proximity to an array of radiators. Each transmit-receive module may include a low-noise amplifier for amplifying received signals (received through a corresponding element of the array of radiators) and a power amplifier for amplifying a signal to be transmitted (i.e., transmitted through a corresponding element of the array of radiators).

It may be advantageous to arrange the modules close together, i.e., at high density on the motherboard, for compactness and to provide short signal paths between the modules and the corresponding antenna elements. Related art designs in which such modules are soldered to the motherboard may be difficult to service, because selective desoldering of any of the modules may be impractical.

Thus, there is a need for an improved design for an electronic module.

SUMMARY

According to some embodiments of the present invention, there is provided a module, including: a substrate; a plurality of electronic components, secured to an upper surface of the substrate; a heat spreader, on the electronic components; a layer of solid thermal interface material in contact with the heat spreader and in contact with an upper surface of a first electronic component of the plurality of electronic components; a standoff, between the substrate and the heat spreader; an alignment element, extending into the substrate through a lower surface of the substrate; a hard stop, under the substrate; and a plurality of compressible interconnects, under the substrate, and extending through the hard stop, the electronic components being within a sight area of the substrate; the substrate having two flanges extending beyond the sight area; the heat spreader abutting against the standoff; the standoff abutting against the substrate; the module being configured: to transmit a compressive load from an upper surface of the standoff to a lower surface of the substrate through a load path not including any of the electronic components, and to transmit a compressive load from an upper surface of the heat spreader to a lower surface of the substrate through a load path not including any of the electronic components; and a pressure transmitted to the first electronic component through the layer of solid thermal interface material having a magnitude of less than 10 pounds per square inch.

In some embodiments, the hard stop is a sheet of polyimide, having a thickness of between 0.005 inches and 0.020 inches, and having a plurality of openings, the compressible interconnects extending through the openings.

In some embodiments, the module is a transmit-receive module for an antenna.

In some embodiments, the transmit-receive module includes a power amplifier.

In some embodiments, the standoff and the heat spreader are separate parts.

In some embodiments, the heat spreader is composed of a material selected from the group consisting of aluminum, copper, and an alloy of aluminum and silicon.

In some embodiments, the heat spreader is a portion of a flat sheet, having a plurality of walls, all of the walls being vertical.

In some embodiments, the standoff is integral with the heat spreader.

In some embodiments, the heat spreader is composed of an alloy of aluminum and silicon, the alloy including between 30% by weight and 55% by weight of silicon.

In some embodiments, the standoff has an opening configured to provide clearance for a shaft of a threaded fastener.

In some embodiments, the opening is a U-shaped cutout.

In some embodiments, a thickness of the standoff is greater than a maximum thickness of the electronic components by between 0.010 inches and 0.040 inches.

In some embodiments, the module further includes a layer of thermal interface material between one of the electronic components and the heat spreader.

In some embodiments, the alignment element is secured in a hole in the substrate with adhesive.

In some embodiments, the hole in the substrate is a blind hole in the substrate.

In some embodiments, the alignment element is a cylinder having a chamfer on a lower edge.

In some embodiments, the alignment element has a chamfer on an upper edge.

In some embodiments, the alignment element is composed of stainless steel.

In some embodiments, the alignment element extends through a hole in the hard stop, a gap between an inner surface of the hole in the hard stop and an outer surface of the alignment element having a width everywhere less than 0.002 inches.

BRIEF DESCRIPTION OF THE DRAWINGS

Features, aspects, and embodiments are described in conjunction with the attached drawings, in which.

Each of the drawings is drawn to scale, for a respective embodiment.

DETAILED DESCRIPTION

The detailed description set forth below in connection with the appended drawings is intended as a description of exemplary embodiments of an electronic module provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1A:
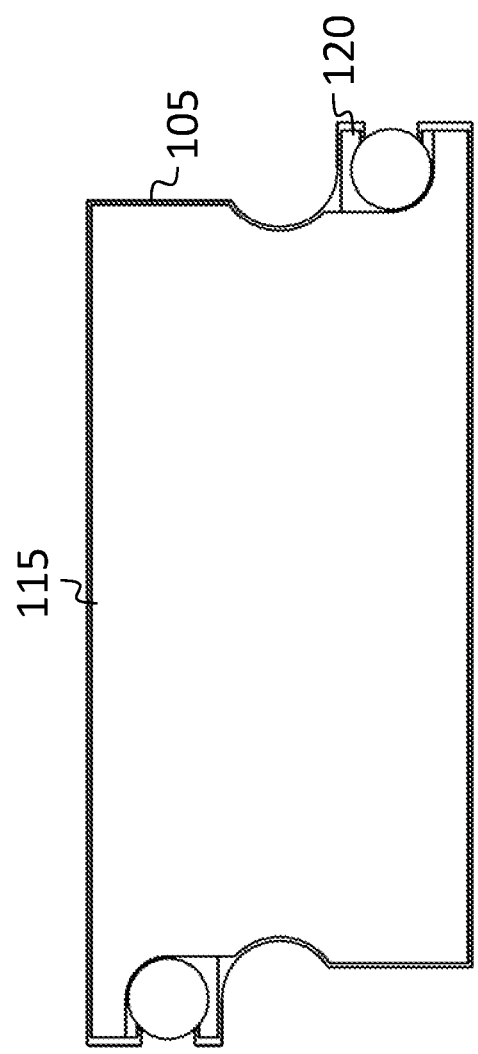
FIG. 1A is a top view of a transmit-receive module, according to an embodiment of the present invention.
Figure 1C:
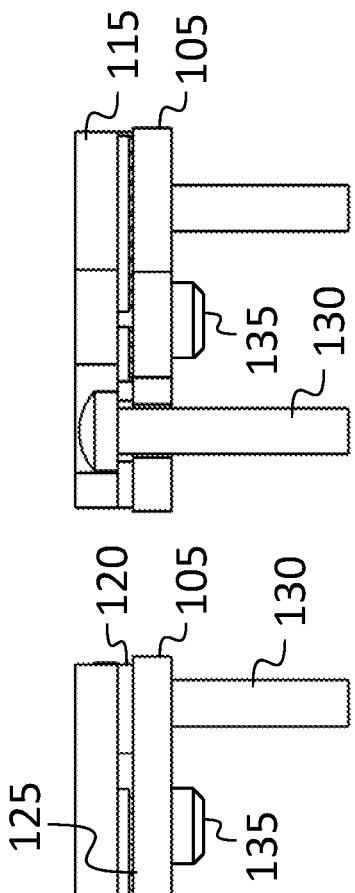
FIG. 1C is an end view of a transmit-receive module, according to an embodiment of the present invention.
Figure 1B:
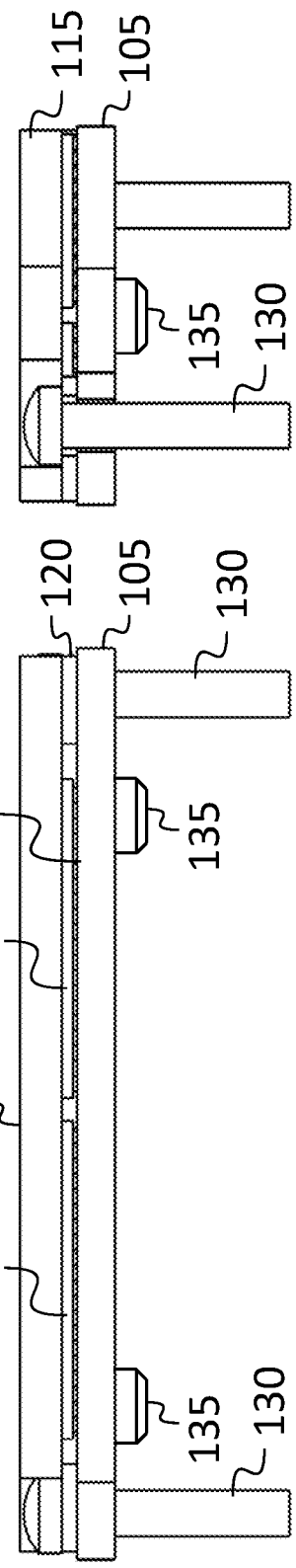
FIG. 1B is a side view of a transmit-receive module, according to an embodiment of the present invention.

Referring to FIGS. 1A-1C, in some embodiments, a transmit-receive module includes a substrate 105, and a plurality of electronic components 110 secured to the substrate. The substrate may be, for example, an organic substrate (e.g., PTFE composites reinforced with glass microfibers) or a ceramic substrate (e.g., alumina, zirconia toughened alumina, aluminum nitride (AlN), silicon nitride (Si3N4)), with conductive traces and/or vias for making connections between the electronic components 110, and between the electronic components 110 and one or more other elements, such as a motherboard on which the transmit-receive module may be installed. The electronic components 110 may be soldered to (i.e., secured, with solder, to) the substrate 105.

A heat spreader 115 may be secured to, and/or in thermal contact with, the upper surfaces of the electronic components 110. The heat spreader 115 may receive heat generated by the electronic components 110 and conduct the heat away to a heat sink, e.g., a liquid-cooled heat sink, configured to cool a plurality of similar modules, that may be referred to as a "cold wall". The heat spreader may be composed of a thermally conductive material, such as copper, or aluminum, or an alloy, such as an alloy of aluminum and silicon (e.g., an alloy of aluminum and silicon containing 42% silicon by weight). As used herein, "composed of" a material means comprising at least 80%, by weight, of the material. The heat spreader may be composed of a material having a thermal conductivity within 50% of 145 W/m/K.

One or more (e.g., two) standoffs 120 may be present between the substrate 105 and the heat spreader 115. These standoffs 120 may set the height of the lower surface of the heat spreader 115 above the upper surface of the substrate 105, and provide a load path that bypasses the electronic components 110, as discussed in further detail below. In some embodiments, the standoffs are composed of polyimide, or 6061 aluminum alloy, or a suitable ceramic (having sufficient strength to transmit the compressive load to which each standoffs is subjected.

A layer of thermal interface material 125 may be present between the electronic components 110 and the heat spreader 115. The layer of thermal interface material 125 may be applied between the electronic components 110 and the heat spreader 115, during assembly. At the time of application, the thermal interface material 125 may be compliant (e.g., a viscous liquid, or a gel), and it may set (or "cure") over some interval of time after assembly to form a solid layer (e.g., a solid, elastomeric layer). During assembly, the layer of thermal interface material 125 may, for example, be applied in a layer on the lower surface of the heat spreader 115 (the layer being thicker than the amount by which the thickness of the standoffs 120 exceeds the thickness of the thinnest one of the electronic components 110), and the heat spreader 115 may then be pressed onto the standoffs 120; in this process some of the layer of thermal interface material 125 may be forced out from between the heat spreader 115 and the electronic components 110, until the thickness of the remaining layer of thermal interface material 125 is equal to the gap between the heat spreader 115 and the electronic components 110 (and fills this gap).

One or more (e.g., two) mounting screws 130 may be used to secure the transmit-receive module to a motherboard. Each of the mounting screws 130 may extend through a standoff 120, through the substrate 105, through a clearance hole in the motherboard, and into a threaded hole in a backer plate below the motherboard. The head of each mounting screw 130 may fit within a cutout in the heat spreader 115 so that it does not contact the heat spreader 115, and the head of each mounting screw 130 may bear down on a respective one of the standoffs 120, which in turn may bear down on the substrate 105, pressing the substrate against the motherboard. The head of each mounting screw may have a recessed feature for receiving a suitable driver; e.g., the head may be a socket head, Torx-plus head or offset cruciform head. The arrangement of one of the mounting screws 130 with respect to the heat spreader 115, the standoffs 120, and the substrate 105 may be more clearly seen in FIG. 2. Each standoff 120 may also function as a washer, spreading the compressive force applied by the head of the mounting screw 130 over a sufficiently large area of the substrate 105 to avoid damaging the substrate 105. The head of each of the mounting screws 130 may be "sub-flush" when the transmit-receive module is secured to the motherboard, i.e., when the transmit-receive module is secured to the motherboard, the top of the head of each of the mounting screws 130 may be below the upper surface of the heat spreader 115, making possible the use of a cold wall with a flat surface abutting against the respective upper surfaces of the heat spreaders 115 of a plurality of transmit-receive modules.

Referring again to FIGS. 1A-1C, in some embodiments, one or more (e.g., two) alignment elements 135, or "alignment pucks" may be employed as alignment cylinders to ensure accurate alignment of the substrate 105 to the motherboard. Each such alignment element 135 may be a stainless cylinder with a chamfer at its lower end as shown in FIGS. 1B and 1C. Each alignment element 135 may be set into a corresponding, close-fitting blind hole or through hole in the substrate 105 and may be secured to the substrate 105 with a suitable adhesive, e.g., with an epoxy. The chamfer at the lower end of each of the alignment elements 135 may facilitate insertion of the alignment elements 135 into corresponding close-fitting holes (e.g., through holes in, or blind holes in the upper surface of) the motherboard. The upper end of each of the alignment elements 135 may also be chamfered, for ease of insertion into the substrate 105 when the transmit-receive module is assembled. In some embodiments, the alignment elements 135, instead of being secured to the transmit-receive module, are secured to the motherboard, and engage corresponding holes in the substrate 105 when the transmit-receive module is installed on the motherboard.

The alignment elements 135 may provide more precise alignment between the transmit-receive module and the motherboard than the mounting screws 130; in the absence of alignment elements 135, the lateral clearances between the mounting screws 130 and the transmit-receive module may be sufficiently large that considerable lateral displacement is possible when the mounting screws 130 are installed (but not yet tightened down). This possible lateral displacement may be sufficiently large that the corresponding alignment error may prevent the forming of proper connections between the transmit-receive module and the motherboard. Each of the alignment elements 135, by contrast, may have an outside diameter that is smaller than the inside diameter of the corresponding hole by between 0.0005 inches and 0.030 inches, and the alignment elements 135 may be separated by between 0.5 inches and 1.3 inches (center to center), resulting in accurate control of the alignment, both in translation and rotation, between the transmit-receive module and the motherboard.

Figure 1D:
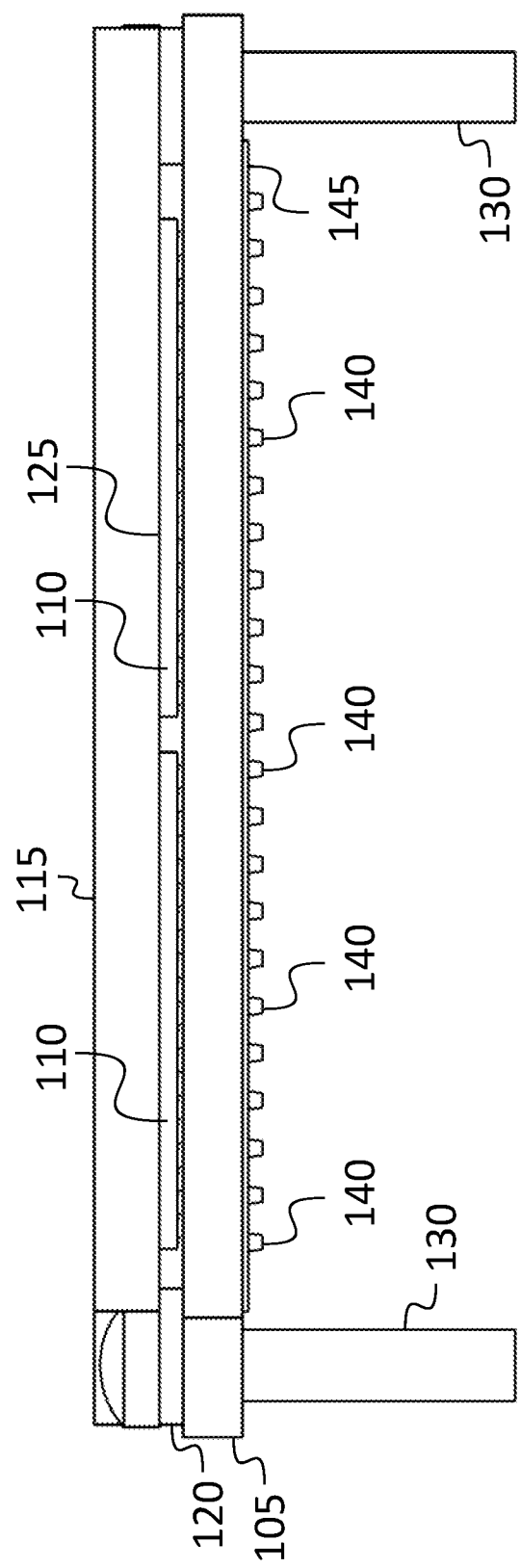
FIG. 1D is a side view of a transmit-receive module, according to an embodiment of the present invention.

Referring to FIG. 1D, in some embodiments, the transmit-receive module includes a plurality of compressible interconnects 140 (e.g., soldered to the lower surface of the substrate 105, or to the upper surface of the motherboard) that, when the transmit-receive module is installed on the motherboard, form a corresponding set of conductive connections to the motherboard. A hard stop 145 may act as a spacer between the transmit-receive module and the motherboard, controlling the extent to which each of the compressible interconnects 140 is compressed when the transmit-receive module is installed on the motherboard. The hard stop 145 may be a sheet of polyimide with a plurality of holes or other openings (e.g., slots or rectangular cutouts) through each of which one or more of the compressible interconnects 140 extend to form connections between the transmit-receive module and the motherboard. The hard stop 145 may have a thickness of about 0.010 inches. The hard stop 145 may have one or more (e.g., two) holes each having an inside diameter slightly greater than the outside diameter of a corresponding alignment element 135, and positioned so that the alignment elements 135 may also serve to align the hard stop 145 to the transmit-receive module and to the motherboard. In some embodiments a hole in the hard stop 145 has a diameter exceeding the diameter of the corresponding alignment element 135 by at most 0.002 inches, so that a gap between an inner surface of the hole in the hard stop 145 and an outer surface of the alignment element 135 has a width everywhere less than 0.002 inches.

The substrate 105 may have a thickness of about 0.080 inches (e.g., between 0.050 inches and 0.120 inches) and may be composed, for example, of FR4 or another suitable reinforced (e.g., fiberglass reinforced) organic material. Each of the compressible interconnects 140 may include a cylinder of conductive (e.g., silver-particle-filled) elastomeric material with a copper solder pad at one end; the compressible interconnect 140 may be secured to the lower surface of the substrate 105 by soldering the solder pad of the compressible interconnect 140 to a corresponding solder pad on the lower surface of the substrate 105. In other embodiments, each of the compressible interconnects 140 may be secured, at one end, to the substrate 105, with conductive (e.g., silver) epoxy. Each of the compressible interconnects 140 may have a diameter of about 0.020 inches and a length of about 0.020 inches. In some embodiments, the force per compressible interconnect may be about 20 g. For an array of compressible interconnects 140 on a pitch of 0.040 inches, this may correspond to an average pressure of about 28 psi being applied to the bottom of the substrate 105. This pressure may be within a critical range between 25 psi and 31 psi within which (i) the pressure is sufficiently small to avoid causing unacceptable warping in the substrate 105 (which could result in damage, e.g., in solder joints securing the electronic components 110 to the substrate 105), and (ii) the pressure is sufficient to compress the compressible interconnects 140 so as to form reliable electrical connections. In some embodiments, the module has a length, a width, and a thickness that are each within 50% of 1.15 inches, 0.47 inches, and 0.12 inches, respectively. This combination of pitch for the compressible interconnects 140, compression force for compressible interconnects 140, transverse dimensions for the substrate 105, and the thickness of the substrate 105, may simultaneously achieve sufficient pressure on the compressible interconnects 140 to make reliable connections while also avoiding unacceptable deformation of the substrate 105 as a result of the force from the compressible interconnects 140.

As mentioned above, when the mounting screws 130 are employed to secure the transmit-receive module to a motherboard, the compressive force applied by the head of the mounting screws 130 may be transmitted along a load path extending through the standoffs 120, and through the substrate 105, to the motherboard, bypassing the electronic components 110. This configuration may be advantageous, compared to one in which the compressive force is, for example, applied to the heat spreader 115 and through a load path passing from the heat spreader 115 through the electronic components 110 and through the substrate 105, because a load path that passes from the heat spreader 115 through the electronic components 110 and through the substrate 105 may cause deformation of the substrate 105 and of the electronic components 110, and may result, for example, in the failure of solder joints used to secure the electronic components 110 to the substrate 105. Similarly, the use of a layer of thermal interface material 125 that cures after assembly may avoid the compressive force that would be applied to the electronic components 110 during operation if instead an elastomeric thermal gasket, having an uncompressed thickness slightly greater than the gap between the heat spreader 115 and the electronic components 110, were used.

The use of a layer of thermal interface material 125 that cures after assembly may result in the cured layer of thermal interface material 125 having an internal compressive or tensile stress due primarily to any expansion or shrinkage that may occur during curing, or with changes in temperature, which may be quite small. In some embodiments the magnitude of the compressive or tensile pressure transferred to the electronic components 110 may be less than 30 pounds per square inch, or less than 10 pounds per square inch, or less than 3 pounds per square inch. In some embodiments, the layer of thermal interface material 125 is a layer of thermally conductive epoxy paste. As used herein, the term "pressure" means a distributed force (having units of force per unit area), which may be positive (for a compressive distributed force) or negative (for a tensile distributed force). The width of the gap between the heat spreader 115 and the electronic components 110 may be between 0.002 inches and 0.005 inches.

Moreover, any compressive force applied to the upper surface of the heat spreader 115 by the cold wall (e.g., through a second, separate layer of layer of compressible thermal interface material between the heat spreader 115 and the cold wall) may be diverted from the electronic components 110 by the heat spreader 115 and transferred, like the compressive force applied by the mounting screws 130, to the motherboard, avoiding transfer of stress through a load path that includes the electronic components 110. In some embodiments, each of the mounting screws 130 applies a compressive force of between 90 and 100 pounds to the heat spreader 115, and the cold wall applies a compressive force of between 140 pounds (which may be the compressive force immediately after assembly) and 80 pounds (which may be the compressive force after the second, separate layer of compressible thermal interface material between the heat spreader 115 and the cold wall has deformed in response to the applied pressure, e.g., a few months after assembly).

Figure 2:
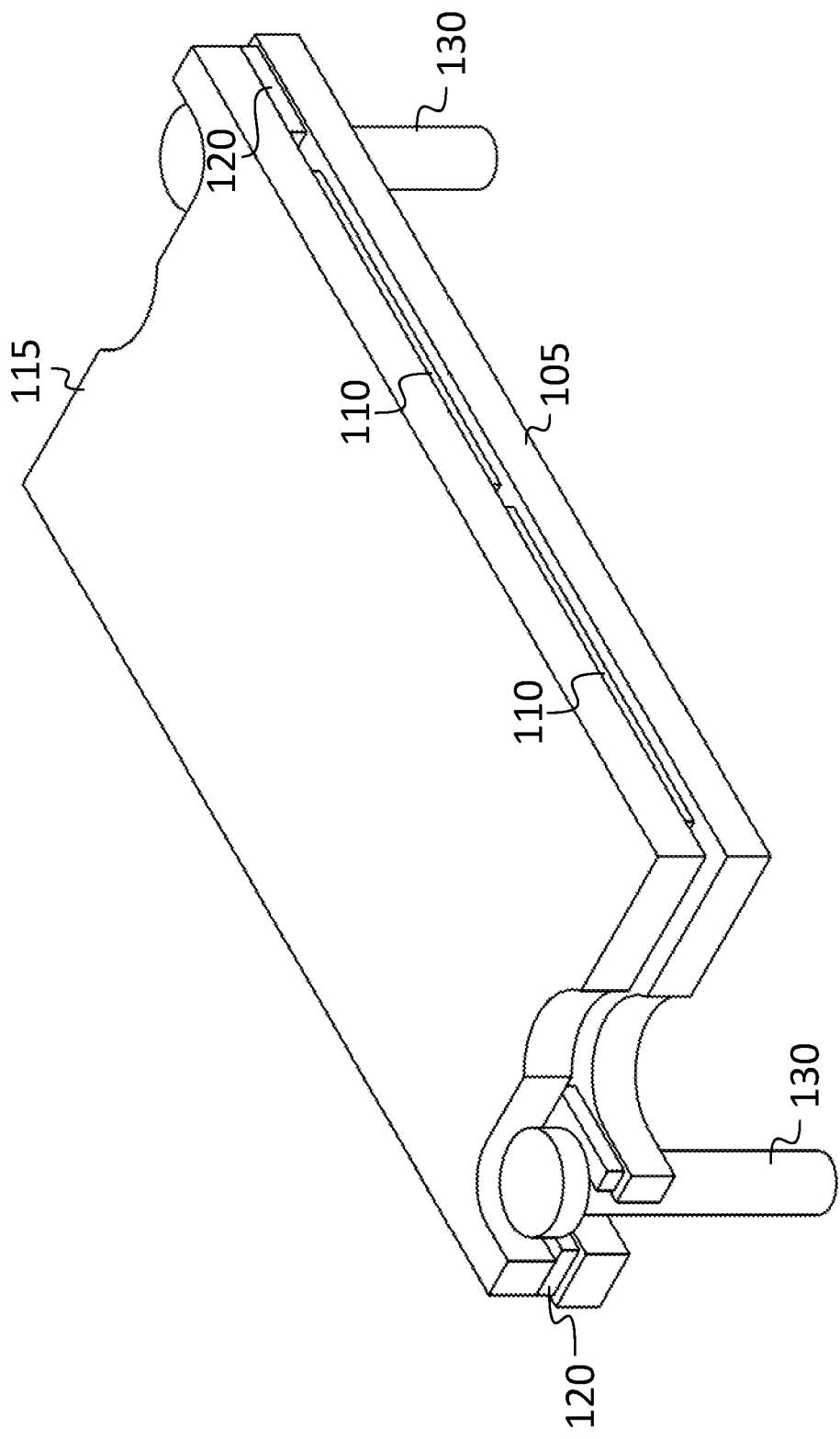
FIG. 2 is a perspective view of a transmit-receive module, according to an embodiment of the present invention.
Figure 3A:
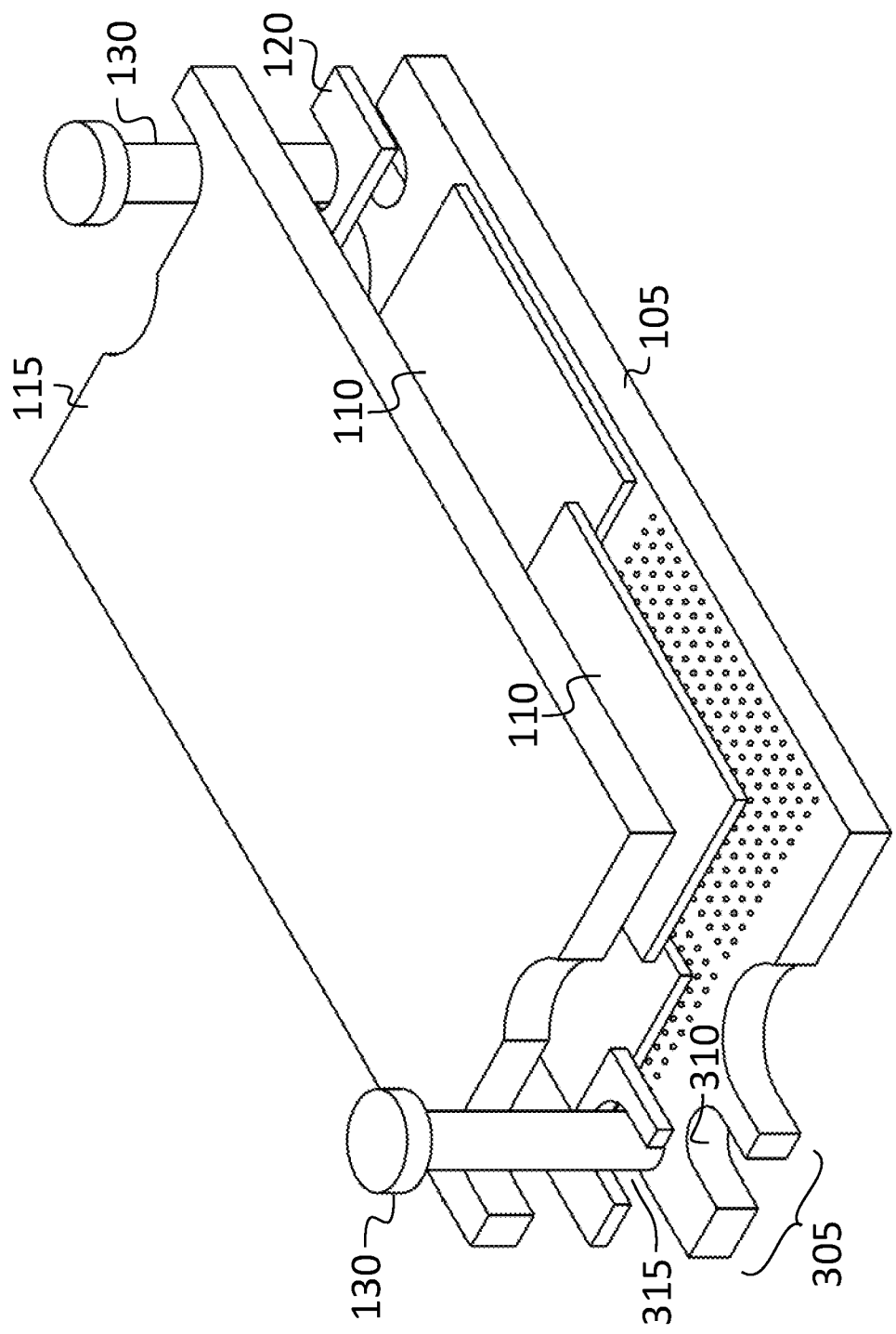
FIG. 3A is an exploded perspective view of a transmit-receive module, according to an embodiment of the present invention.
Figure 3B:
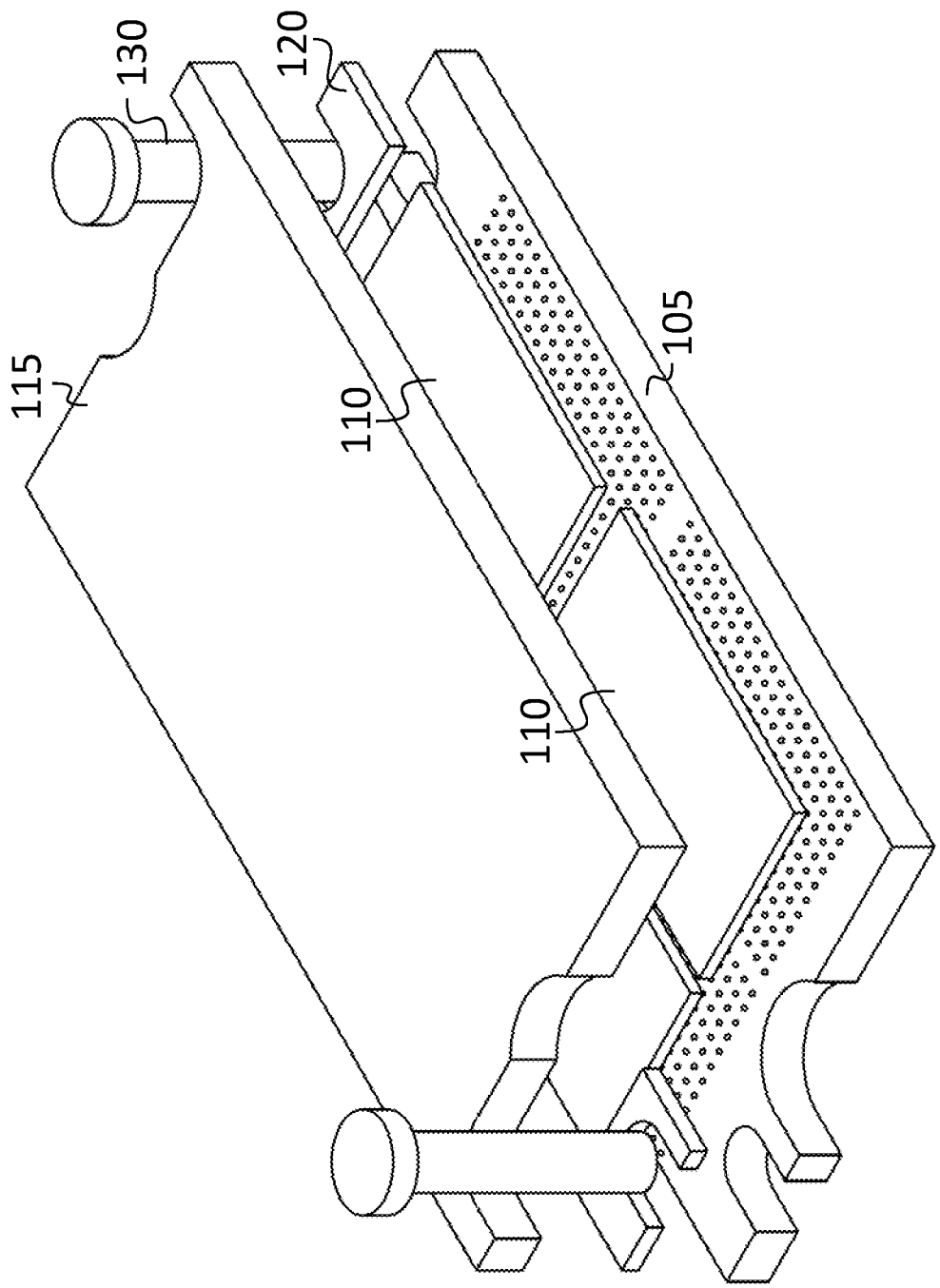
FIG. 3B is an exploded perspective view of a transmit-receive module, according to an embodiment of the present invention.
Figure 3C:
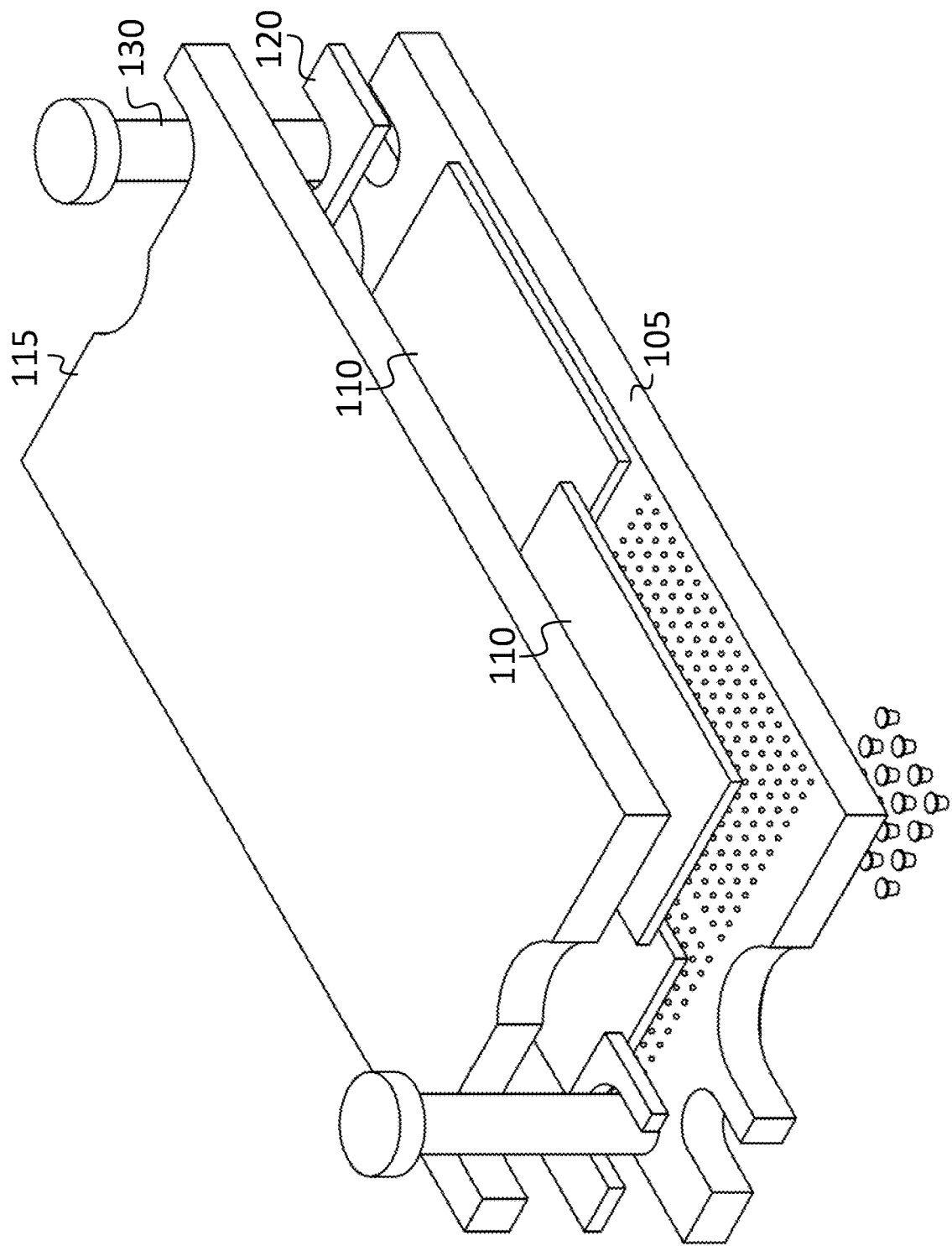
FIG. 3C is an exploded perspective view of a transmit-receive module, according to an embodiment of the present invention.
Figure 4A:
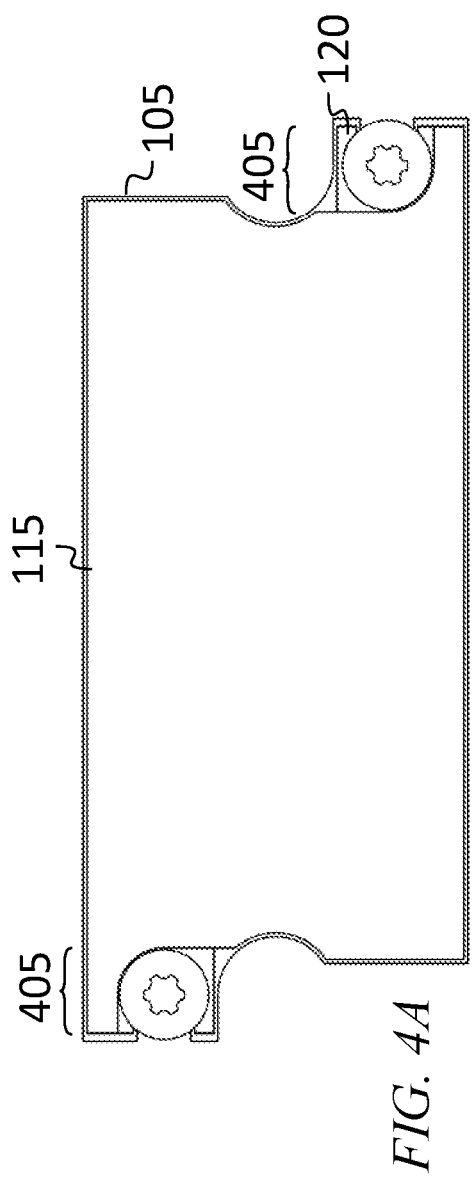
FIG. 4A is a top view of a transmit-receive module, according to an embodiment of the present invention.
Figure 4C:
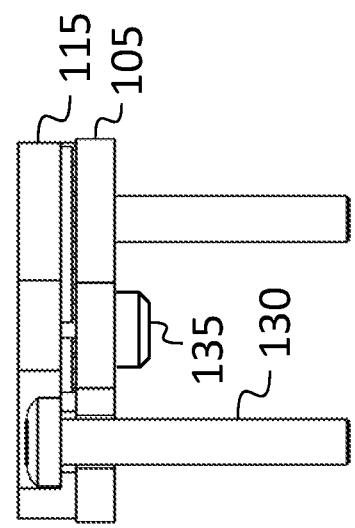
FIG. 4C is an end view of a transmit-receive module, according to an embodiment of the present invention.
Figure 4B:
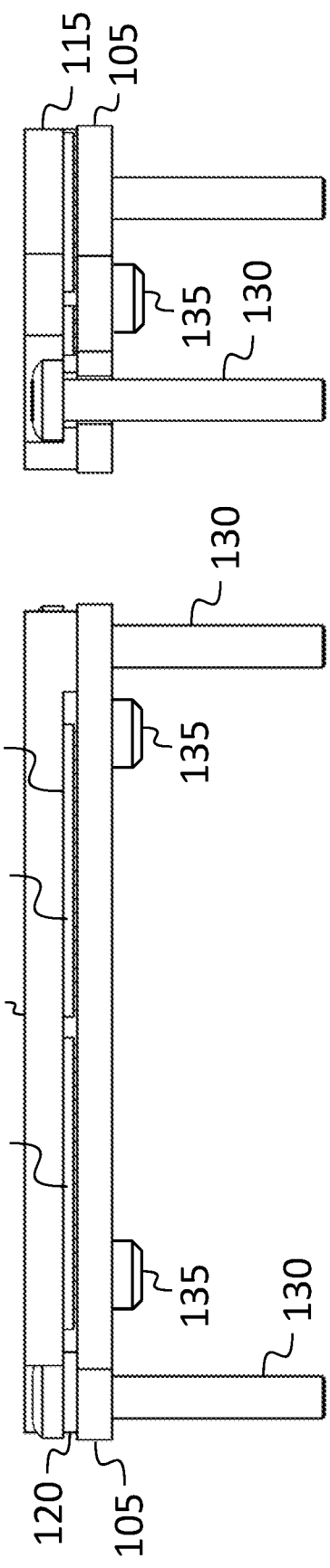
FIG. 4B is a side view of a transmit-receive module, according to an embodiment of the present invention.
Figure 5A:
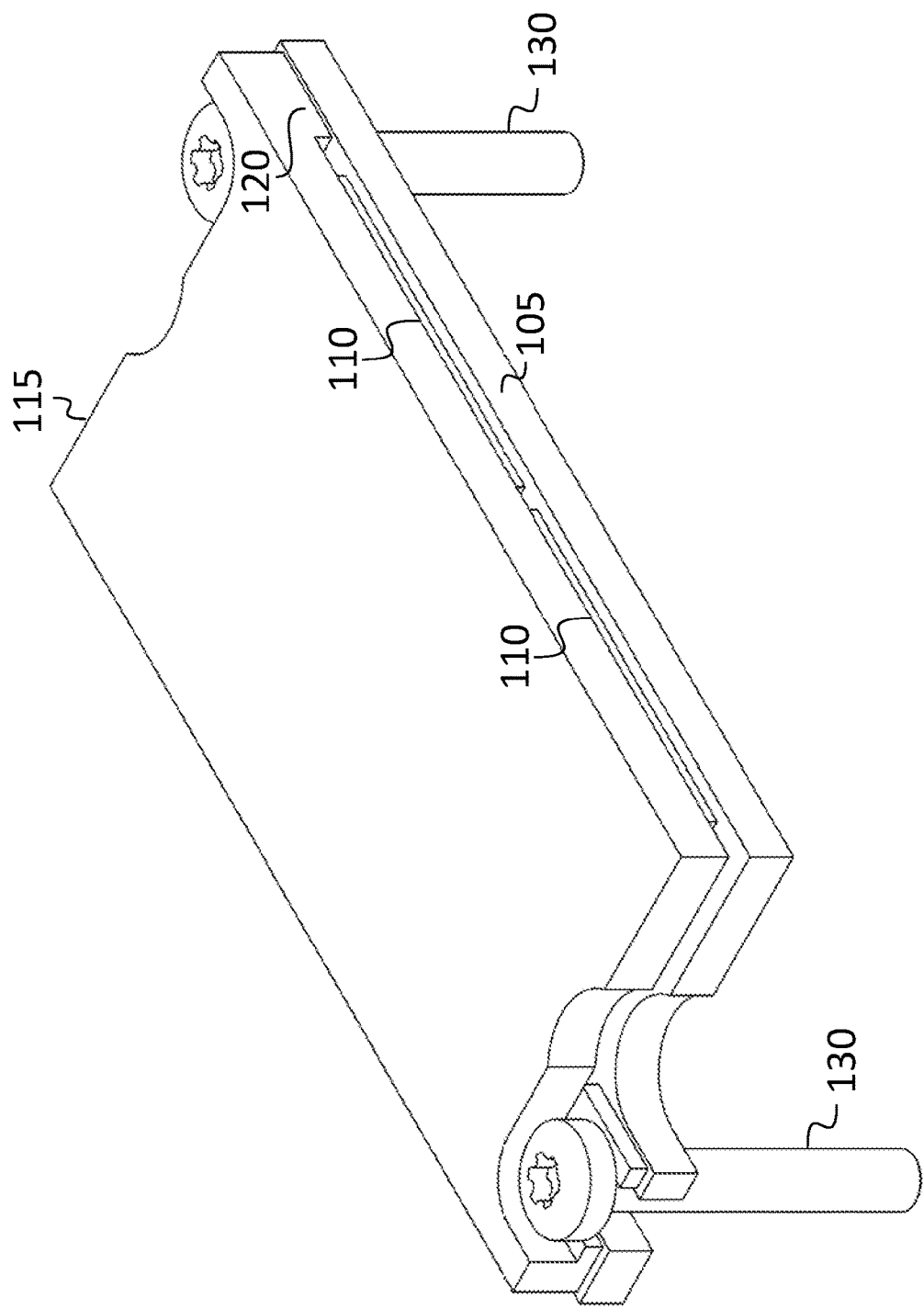
FIG. 5A is an exploded perspective view of a transmit-receive module, according to an embodiment of the present invention.
Figure 5B:
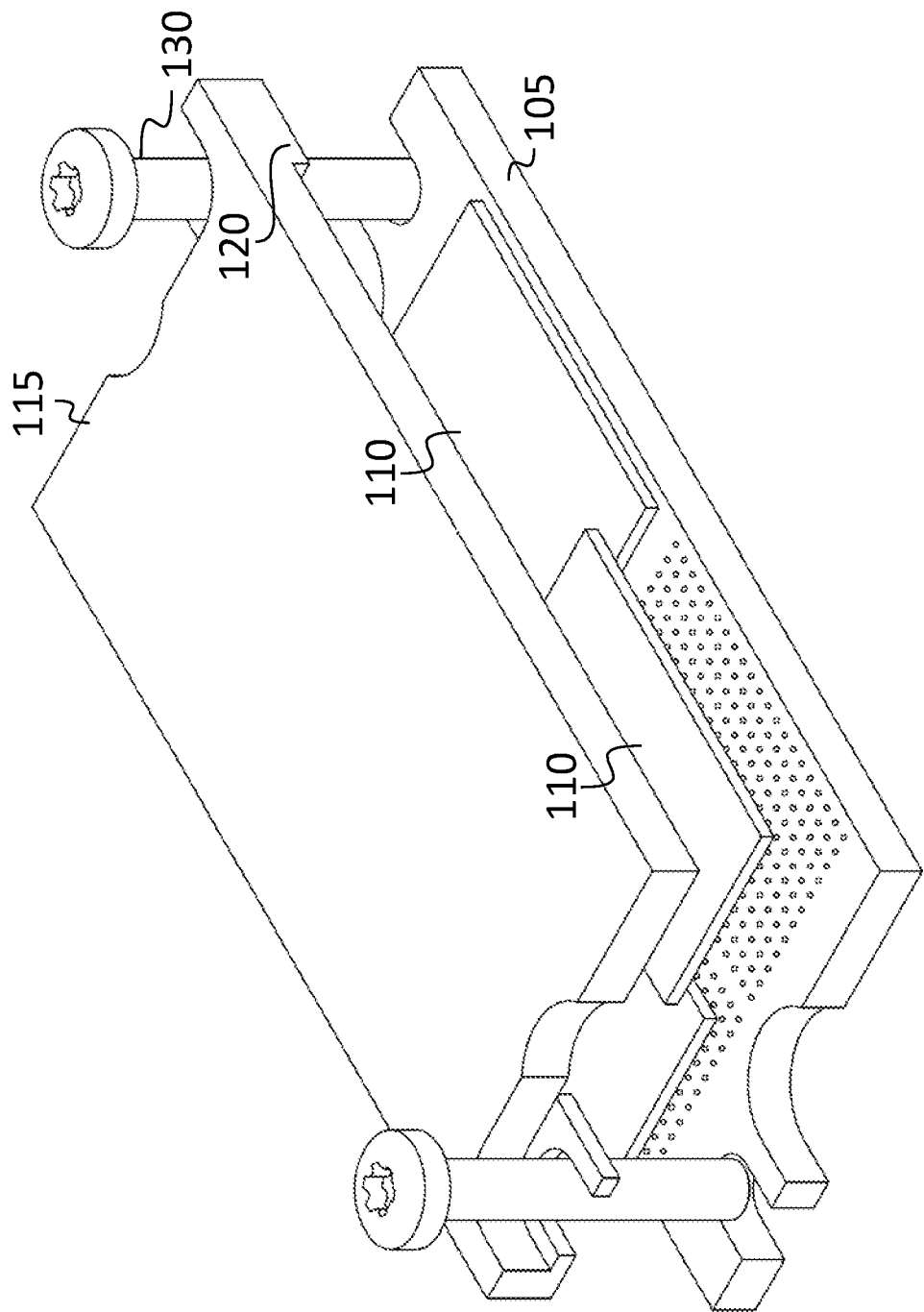
FIG. 5B is an exploded perspective view of a transmit-receive module, according to an embodiment of the present invention.
Figure 5C:
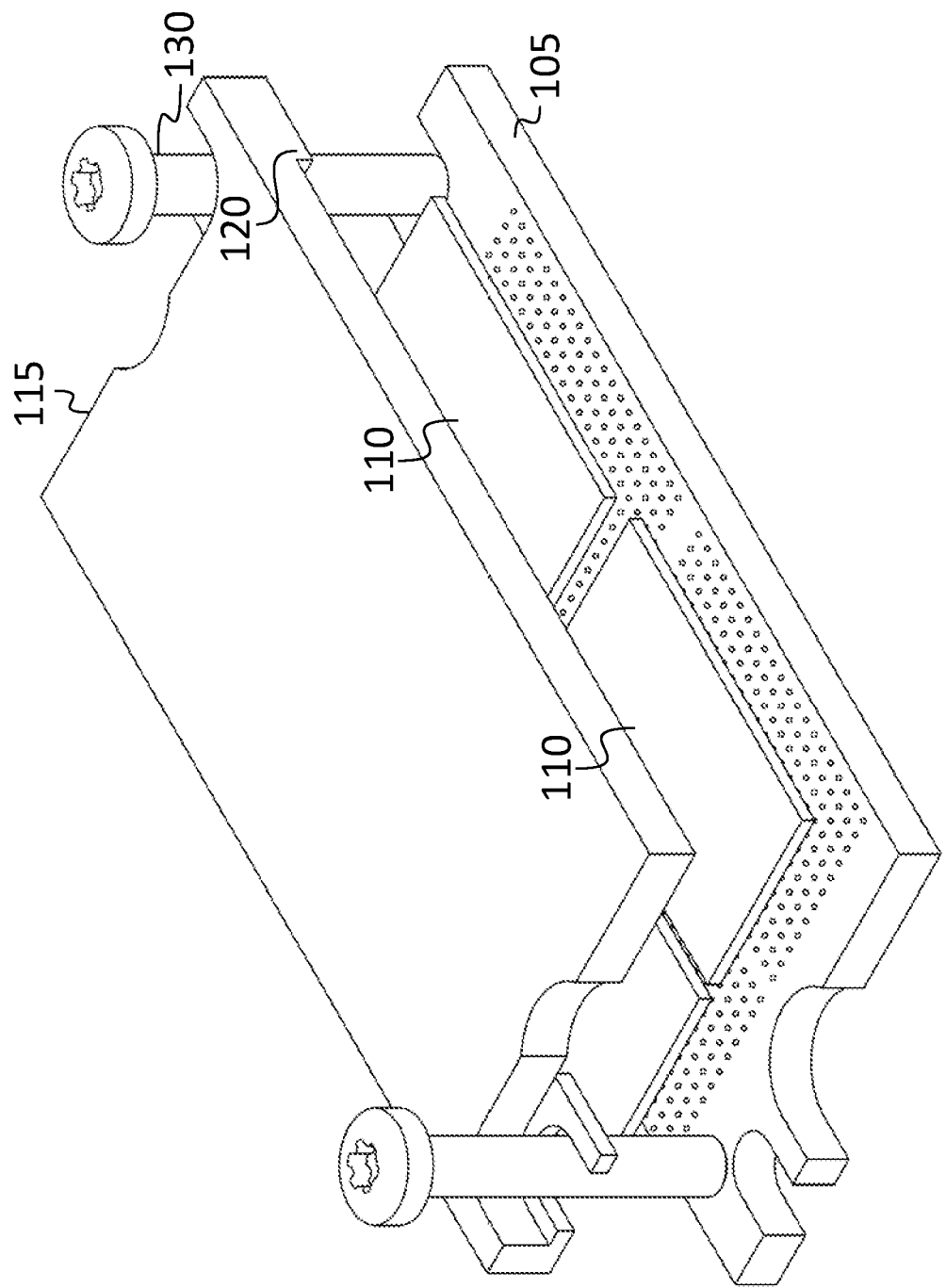
FIG. 5C is an exploded perspective view of a transmit-receive module, according to an embodiment of the present invention.
Figure 5D:
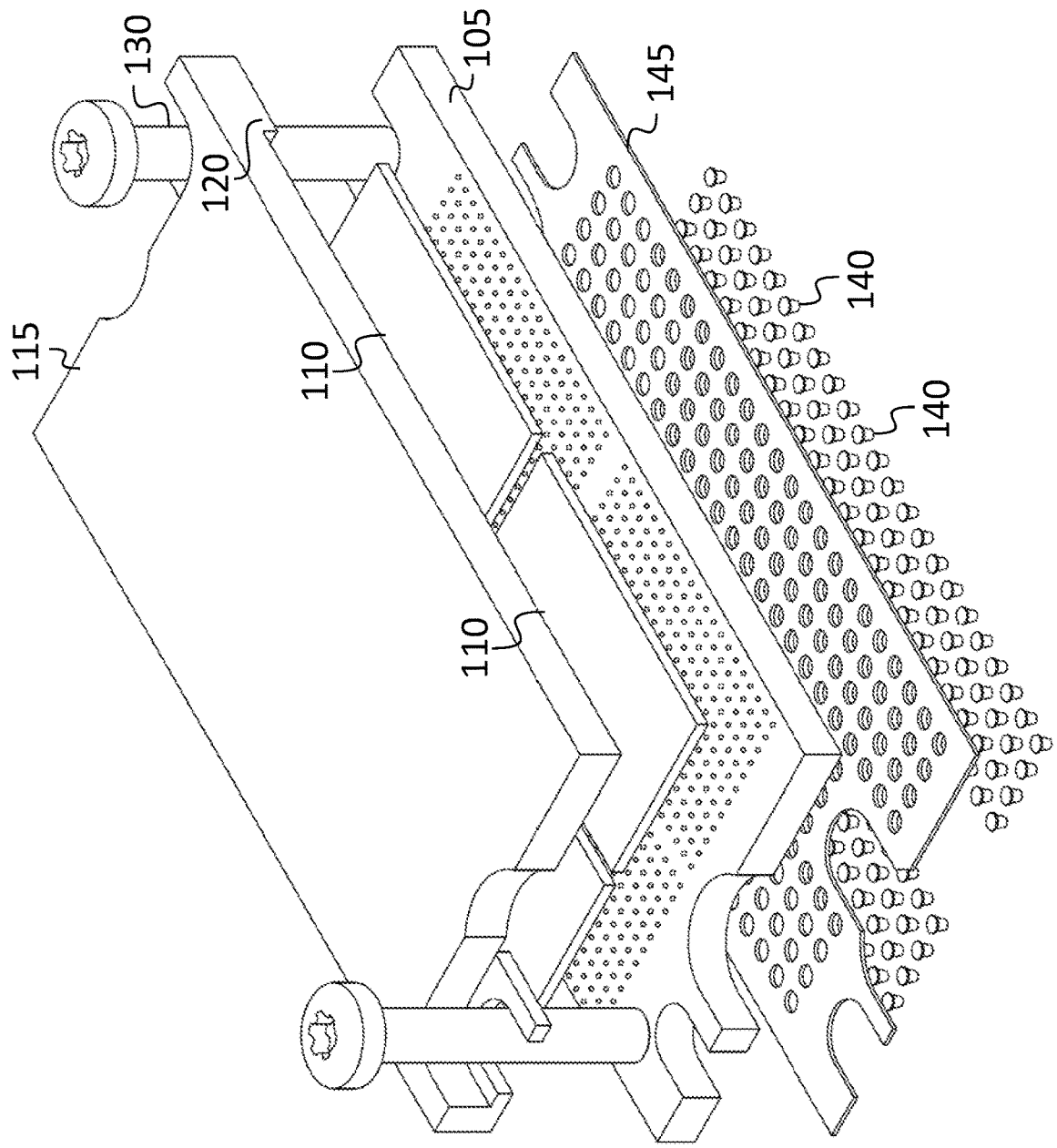
FIG. 5D is an exploded perspective view of a transmit-receive module, according to an embodiment of the present invention.
Figure 5E:
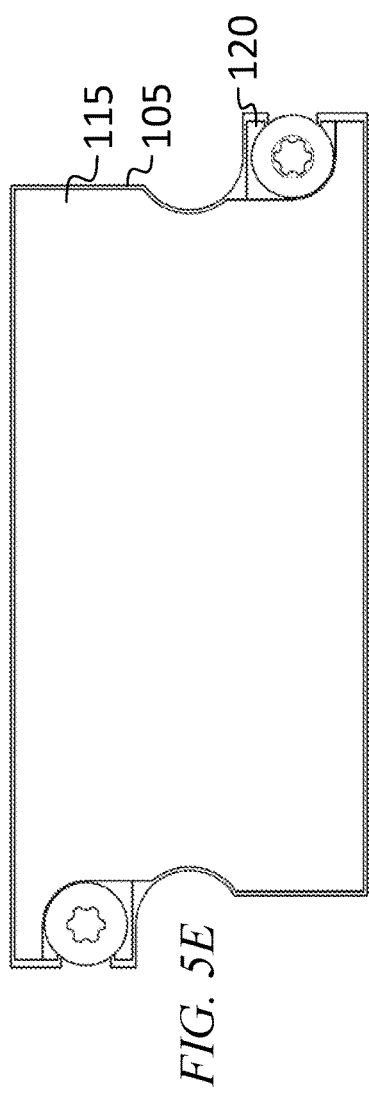
FIG. 5E is a top view of a transmit-receive module, according to an embodiment of the present invention.
Figure 5F:
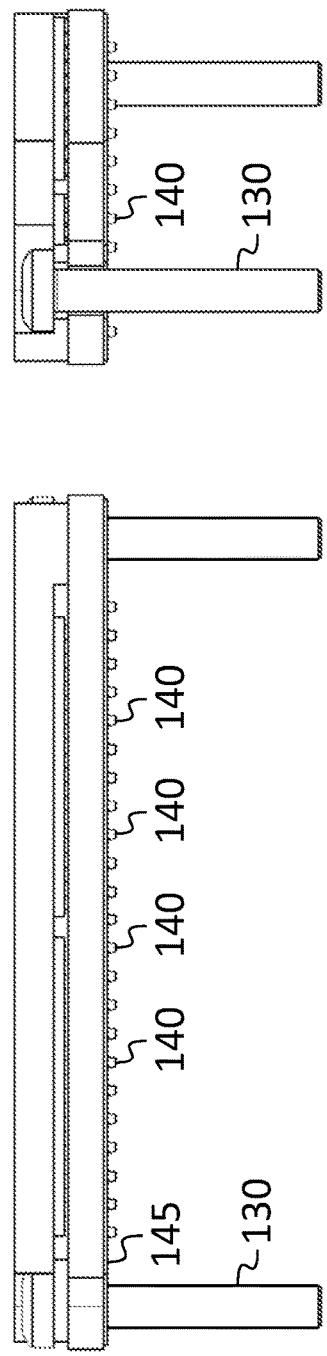
FIG. 5F is a side view of a transmit-receive module, according to an embodiment of the present invention.
Figure 5G:
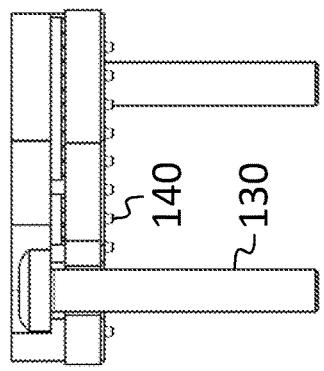
FIG. 5G is an end view of a transmit-receive module, according to an embodiment of the present invention.
Figure 5H:
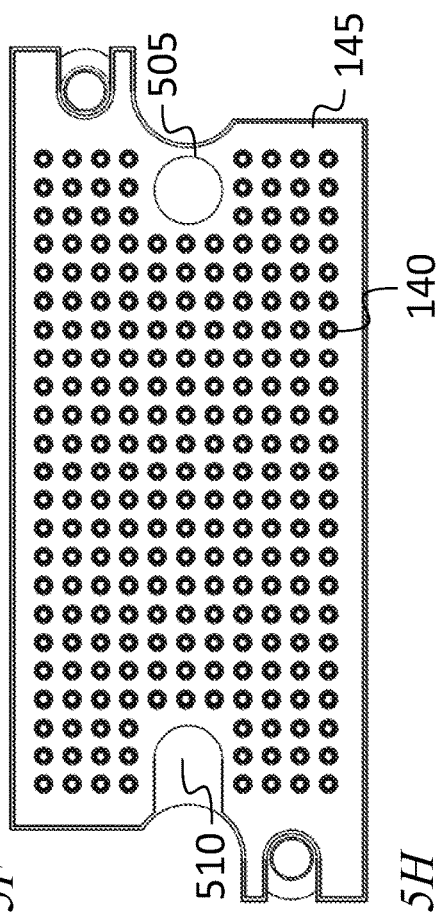
FIG. 5H is a bottom view of a transmit-receive module, according to an embodiment of the present invention.

FIG. 2 shows a perspective view, in some embodiments, of a transmit-receive module and the two mounting screws 130 that may be employed to secure it to a motherboard. FIGS. 3A-3C show various exploded perspective views of a transmit-receive module, in some embodiments. In the embodiments of FIGS. 1A-3C, the heat spreader 115 may have walls that are everywhere vertical and, as a result, the heat spreader 115 may be fabricated from a sheet of material using a low-cost fabrication method such as waterjet cutting. As shown in FIG. 3A, the electronic components 110 of each transmit-receive module may be installed on a region of the substrate 105, which may be referred to as the "sight" or "sight area" of the substrate 105; the substrate 105 may have two two-pronged flanges 305, or "tabs", or "ears", extending beyond the sight, and each of the flanges 305 may have a through-hole for one of the mounting screws 130, or, as shown in FIG. 3A, an open cutout 310 (e.g., a U-shaped cutout, separating the two prongs) for the shaft of the mounting screw 130. Each of the standoffs 120 may similarly have an opening, such as a hole or, as shown in FIG. 3A, an open cutout 315 (e.g., a U-shaped cutout), for the mounting screw 130. To increase the contact area to the cold wall, the heat spreader 115 may have a two-pronged tab similar to that of the substrate 105 of FIG. 3A, or, as shown in FIG. 3A, the heat spreader 115 may have a single-pronged tab.

In some embodiments, the standoffs 120 may be integral parts of the heat spreader 115, each being part of a wing 405 that extends outward from the body of the heat spreader 115. FIGS. 4A-C, and FIGS. 5A-5H show orthogonal views, and various exploded perspective views, respectively, of a transmit-receive module, in some embodiments, in which the standoffs 120 are integrated into the heat spreader 115. One or more holes 505 or cutouts 510 in the hard stop 145 may engage alignment elements (e.g., alignment pucks) secured to the motherboard, as mentioned above. In such embodiments, the heat spreader 115 with integrated standoffs 120 may be composed of a material (i) that has a high thermal conductivity (e.g., a thermal conductivity that is within 50% of 145 W/m/K), and (ii) that has suitable mechanical properties (e.g., adequate yield strength) to perform the functions of the standoffs 120 (e.g., spreading the compressive force applied by the heads of the mounting screws 130 over a sufficiently large area of the substrate 105 to avoid damaging the substrate 105).

Compared to embodiments in which a plurality of transmit-receive modules are soldered to a motherboard, some embodiments have the advantage that any transmit-receive module may be individually removed and replaced, greatly facilitating the servicing of an assembly in which one transmit-receive module has failed (or a small number of transmit-receive module have failed). Further, the alignment elements 135 may make possible a blind-mate installation of each transmit-receive module, i.e., each module may be placed into position and the correct alignment of the connections to the motherboard may be ensured by the constraints of the alignment elements 135, and it may be unnecessary, for example, for a user to monitor the alignment visually while the module is positioned.

Although some embodiments described herein relate to a transmit-receive module, the present disclosure is not limited to such modules, and aspects of the disclosure may apply to other kinds of modules designed to be mounted on a motherboard, such as computing modules, for example.

Although limited embodiments of an electronic module have been specifically described and illustrated herein, many modifications and variations will be apparent to those skilled in the art. Accordingly, it is to be understood that an electronic module employed according to principles of this invention may be embodied other than as specifically described herein. The invention is also defined in the following claims, and equivalents thereof.

What is claimed is:
1. A module, comprising:
   a substrate;
   a plurality of electronic components, secured to an upper surface of the substrate within a sight area of the substrate;
   a heat spreader, on the electronic components, and having one or more cutoffs on a side;
   a layer of solid thermal interface material in contact with the heat spreader and in contact with an upper surface of a first electronic component of the plurality of electronic components;
   a standoff between the substrate and the heat spreader, wherein a first portion of the standoff is in contact with the heat spreader and a second portion of the standoff is in contact with the substrate and not in contact with the heat spreader;
   an alignment element, extending into the substrate through a lower surface of the substrate;
   a hard stop, under the substrate; and one or more mounting screws, each having a head to secure the module to a motherboard, wherein the head of each mounting of the screws is below an upper surface of the heat spreader and disposed within a respective one of the one or more cutoffs of the heat spreader, the substrate having two flanges extending beyond the sight area.

2. The module of claim 1, wherein the hard stop is a sheet of polyimide, having a thickness of between 0.005 inches and 0.020 inches, a plurality of compressible interconnects under the substrate extending through the hard stop and having a plurality of openings, the compressible interconnects extending through the openings.

3. The module of claim 1, wherein the module is a transmit-receive module for an antenna.

4. The module of claim 3, wherein the transmit-receive module comprises a power amplifier.

5. The module of claim 1, wherein the standoff and the heat spreader are separate parts.

6. The module of claim 5, wherein the heat spreader is composed of a material selected from the group consisting of aluminum, copper, and an alloy of aluminum and silicon.

7. The module of claim 5, wherein the heat spreader is a portion of a flat sheet, having a plurality of walls, all of the walls being vertical.

8. The module of claim 1, wherein the standoff is integral with the heat spreader.

9. The module of claim 8, wherein the heat spreader is composed of an alloy of aluminum and silicon, the alloy comprising between 30% by weight and 55% by weight of the silicon.

10. The module of claim 1, wherein the standoff has one or more openings to provide clearance for a respective one of the mounting screws.

11. The module of claim 1, wherein the heat spreader includes a U-shaped cutout.

12. The module of claim 1, wherein a thickness of the standoff is greater than a maximum thickness of the electronic components by between 0.010 inches and 0.040 inches.

13. The module of claim 1, wherein the alignment element is secured in a hole in the substrate with an adhesive.

14. The module of claim 13, wherein the hole in the substrate is a blind hole in the substrate.

15. The module of claim 1, wherein the alignment element is a cylinder having a chamfer on a lower edge.

16. The module of claim 15, wherein the alignment element has a chamfer on an upper edge.

17. The module of claim 1, wherein the alignment element is composed of stainless steel.

18. The module of claim 1, wherein the alignment element extends through a hole in the hard stop, a gap between an inner surface of the hole in the hard stop and an outer surface of the alignment element having a width everywhere less than 0.002 inches.

* * * * *